United States Patent
Miyata et al.

(10) Patent No.: US 12,526,917 B2
(45) Date of Patent: Jan. 13, 2026

(54) CIRCUIT BOARD AND METHOD OF PRODUCTION THEREFOR

(71) Applicant: DENKA COMPANY LIMITED, Tokyo (JP)

(72) Inventors: Kenji Miyata, Machida (JP); Shohji Iwakiri, Chikushino (JP); Saori Inoue, Kobe (JP)

(73) Assignee: DENKA COMPANY LIMITED, Tokyo (JP)

( * ) Notice: Subject to any disclaimer, the term of this patent is extended or adjusted under 35 U.S.C. 154(b) by 255 days.

(21) Appl. No.: 18/271,284

(22) PCT Filed: Mar. 22, 2022

(86) PCT No.: PCT/JP2022/013137
§ 371 (c)(1),
(2) Date: Jul. 7, 2023

(87) PCT Pub. No.: WO2022/210089
PCT Pub. Date: Oct. 6, 2022

(65) Prior Publication Data
US 2024/0064895 A1    Feb. 22, 2024

(30) Foreign Application Priority Data

Mar. 30, 2021   (JP) ................. 2021-058366

(51) Int. Cl.
*H05K 1/03* (2006.01)
*C04B 37/00* (2006.01)
(Continued)

(52) U.S. Cl.
CPC ......... *H05K 1/0306* (2013.01); *C04B 37/001* (2013.01); *C04B 37/021* (2013.01);
(Continued)

(58) Field of Classification Search
CPC ............. H05K 1/0306; H05K 3/4644; H05K 2201/0175; H05K 2203/085;
(Continued)

(56) References Cited

U.S. PATENT DOCUMENTS

2017/0019990 A1* 1/2017 Takemura ............ H05K 1/0271
2019/0092695 A1* 3/2019 Nishi .................. C04B 38/0054

FOREIGN PATENT DOCUMENTS

JP       2009-49062 A        3/2009
JP       2015141952 A    *   8/2015
(Continued)

OTHER PUBLICATIONS

JP 2015141952 A Machine Translation (Year: 2015).*
Jun. 21, 2022 International Search Report issued in International Patent Application No. PCT/JP2022/013137.

*Primary Examiner* — Travis M Figg
(74) *Attorney, Agent, or Firm* — Oliff PLC

(57) ABSTRACT

A circuit board having electrodes has good thermal conductivity and excellent voltage resistance and a method of producing the same. The circuit board includes a first ceramic layer, a second ceramic layer laminated thereon, and a first metal layer between the ceramic layers. The circuit board has a metal layer existing zone between the ceramic layers, and a metal layer non-existing zone having no metal layer between the ceramic layers. The ceramic layers join in the metal layer non-existing zone, and the second ceramic layer is a porous boron nitride layer having voids filled with a thermosetting composition cured material. The method includes disposing a second ceramic sheet on a first laminate metal layer including a first ceramic layer and the first metal layer laminated thereon, and pressurizing under heating. The second ceramic sheet is a porous boron nitride sheet having voids filled with a thermosetting composition semi-cured material.

13 Claims, 7 Drawing Sheets

(51) Int. Cl.
*C04B 37/02* (2006.01)
*H05K 3/46* (2006.01)

(52) U.S. Cl.
CPC ...... *H05K 3/4644* (2013.01); *C04B 2237/361* (2013.01); *C04B 2237/68* (2013.01); *H05K 2201/0175* (2013.01); *H05K 2203/085* (2013.01)

(58) Field of Classification Search
CPC ............... C04B 37/001; C04B 37/021; C04B 2237/361; C04B 2237/68
See application file for complete search history.

(56) References Cited

FOREIGN PATENT DOCUMENTS

| | | | | |
|---|---|---|---|---|
| JP | 2016103611 A | * | 6/2016 | |
| WO | 2015/022956 A1 | | 2/2015 | |
| WO | 2017/061324 A1 | | 4/2017 | |
| WO | WO-2017155110 A1 | * | 9/2017 | ......... C08G 59/4071 |
| WO | 2019/172345 A1 | | 9/2019 | |

* cited by examiner (a)

(b)

(c)

(d)

(e)

CIRCUIT BOARD AND METHOD OF PRODUCTION THEREFOR

TECHNICAL FIELD

The present invention relates to a circuit board and a method of producing the same.

BACKGROUND ART

Along with the enhancement in performance and the reduction in size of electronic equipments, such as a mobile phone, an LED illumination equipment, and an on-board power module, in recent years, the implementation techniques have drastically advanced in the stages including a semiconductor device, printed wiring board implementation, and device implementation. According to the trend, the heat generation density inside the electronic equipments is being increased over the years, and there is an important issue: how to dissipate efficiently the heat generated during use. A thermally conductive insulating adhesive sheet for fixing an electronic component is demanded to have an unprecedentedly high thermal conductivity, in addition to the insulation and the adhesiveness.

The thermally conductive insulating adhesive sheet having been used includes a thermosetting resin composition obtained in such a manner that ceramic powder having a high thermal conductivity, such as aluminum oxide, silicon nitride, boron nitride, and aluminum nitride, is dispersed in a thermosetting resin in an uncured state (A-stage), and then the composition is molded into a sheet form, for example, by coating with various coater, to make the thermosetting resin into a semi-cured state (B-stage) by heating.

The thermally conductive insulating adhesive sheet is adhered to an electronic component, such as a metal circuit and a metal sheet, and then heated to melt the thermosetting resin in a semi-cured state (B-stage), which is thereby allowed to penetrate to the unevenness on the surface of the electronic component for exhibiting the adhesiveness of the thermally conductive insulating adhesive sheet to the electronic component, and furthermore the thermosetting resin is made into a completely cured state (C-stage) by heating, so as to enhance the adhesion to the electronic component.

The thermally conductive insulating adhesive sheet has been widely used since the sheet is free of necessity to form an adhesive layer (which is a thermosetting resin in an uncured state (A-stage) or a thermosetting resin in an uncured state (A-stage) having ceramic powder dispersed therein) between an electronic component, such as a metal circuit and a metal sheet, and the sheet, which eliminates the implementation of a coating operation and a precise coating equipment, and significantly simplifies the user operations.

PTL 1 enables to provide a metal base circuit board excellent in heat radiation capability in a convenient method in such a manner that in a metal base circuit board, a metal foil is disposed on a thermally conductive insulating adhesive sheet containing a thermosetting resin in a semi-cured state (B-stage) having ceramic powder dispersed therein, and in this state, the thermosetting resin contained in the thermally conductive insulating adhesive sheet is cured to C-stage.

However, the invention of PTL 1 includes the thermosetting resin layer having a low thermal conductivity existing among the particles of the ceramic powder, and thus has limitation in providing a high thermal conductivity for a circuit board. Therefore, there is room for improvement in heat radiation capability in the demand in thermal design of electronic equipments, which is becoming severer more than ever in recent years.

As a method for improving the thermal conductivity of the metal base board described in PTL 1, for example, it is considered to adhere a metal foil to one surface of a metal base sheet with a thermally conductive insulating adhesive sheet using a ceramics-resin composite impregnated with a thermosetting resin composition, with a sintered material having an integrated structure including non-oxide ceramic primary particles that are continuous three-dimensionally (see, for example, PTL 2). The thermally conductive insulating adhesive sheet can have a further higher thermal conductivity since the non-oxide ceramics form a continuous network.

CITATION LIST

Patent Literatures

PTL 1: JP 2009-49062 A
PTL 2: WO 2017/155110

SUMMARY OF INVENTION

Technical Problem

Along with the increase in capability of the circuit board in recent years, electrodes are desirably formed inside the circuit board. For example, the combination of electrodes formed on the surface of the circuit board and electrodes formed inside the circuit board enables the formation of a more complicated circuit on the circuit board. The formation of electrodes inside the circuit boards enables the formation of a noise shield inside the circuit board for suppressing the influence of noise on the circuit formed on the surface of the circuit board. In the case where a wiring line is formed on the surface of the circuit board, furthermore, the wiring line formed on the surface of the circuit board and a wiring line formed inside the circuit board can be disposed to face closely each other with a ceramic layer intervening therebetween, and thereby the inductance of the wiring line formed on the surface of the circuit board can be reduced.

Electrodes can be formed inside the circuit board by laminating the thermally conductive insulating adhesive sheet described in PTL 2 on the surface of a ceramic layer having electrodes formed on the surface thereof. In this case, the distance between the electrodes formed on the surface of the circuit board and the electrodes formed inside the circuit board can be reduced, and therefore the circuit board is demanded to have a further higher voltage resistance.

Under the circumstances, an object of the present invention is to provide a circuit board having electrodes therein that has a good thermal conductivity and an excellent voltage resistance and a method of producing the same.

Solution to Problem

It has been recognized that a porous boron nitride sheet having voids filled with a semi-cured material of a thermosetting composition has poor flexibility, and therefore even though the porous boron nitride sheet is laminated on a ceramic layer having electrodes formed on the surface thereof, the joint between the porous boron nitride sheet and the ceramic layer becomes insufficient due to steps caused by the electrodes. However, as a result of the earnest investigations made by the present inventors, it has been found that the porous boron nitride sheet can be sufficiently joined to the surface of the ceramic layer having electrodes formed on the surface thereof, by sufficiently investigating the pressurizing condition in laminating the porous boron nitride sheet, and consequently the voltage resistance of the circuit board having electrode therein can be improved.

The present invention is based on the aforementioned knowledge, and includes the following aspects.

[1] A circuit board including a first ceramic layer, a second ceramic layer laminated on the first ceramic layer, and a first metal layer disposed between the first ceramic layer and the second ceramic layer, having a metal layer existing zone having the first metal layer existing between the first ceramic layer and the second ceramic layer, and a metal layer non-existing zone having no first metal layer existing between the first ceramic layer and the second ceramic layer, the first ceramic layer and the second ceramic layer being joined to each other in the metal layer non-existing zone, the second ceramic layer being a porous boron nitride layer having voids filled with a cured material of a thermosetting composition.

[2] The circuit board according to the item [1], wherein the first ceramic layer is a porous boron nitride layer having voids filled with a cured material of a thermosetting composition.

[3] The circuit board according to the item [1] or [2], wherein the first metal layer has a thickness that is ¼ or less of a thickness of the second ceramic layer.

[4] The circuit board according to any one of the items [1] to [3], wherein the first metal layer has a side surface that is covered with the second ceramic layer.

[5] The circuit board according to any one of the items [1] to [4], wherein the circuit board further includes a second metal layer that is joined to a surface of the first ceramic layer opposite to a surface thereof on the side of the second ceramic layer.

[6] The circuit board according to any one of the items [1] to [5], wherein the circuit board further includes a third metal layer that is formed on a surface of the second ceramic layer opposite to a surface thereof on the side of the first ceramic layer.

[7] The circuit board according to any one of the items [1] to [6], wherein the second ceramic layer has an opening, and the first metal layer is exposed in the opening.

[8] A method of producing a circuit board, including a step of disposing a second ceramic sheet on a first metal layer of a first laminate including a first ceramic layer and the first metal layer laminated on the first ceramic layer, and pressurizing at a pressure of 1 to 20 MPa for a pressurizing time of 10 minutes to 30 hours under heating to a heating temperature of 150 to 260° C., so as to produce a second laminate including the first ceramic layer, a second ceramic layer laminated on the first ceramic layer, and a first metal layer disposed between the first ceramic layer and the second ceramic layer, the second ceramic sheet being a porous boron nitride sheet having voids filled with a semi-cured material of a thermosetting composition.

[9] The method of producing a circuit board according to the item [8], wherein the step of producing the second laminate includes pressurizing under heating in vacuum.

[10] The method of producing a circuit board according to the item [8] or [9], wherein the method further includes a step of roughening a surface of the first metal layer of the first laminate.

[11] The method of producing a circuit board according to any one of the items [8] to [10], wherein the method further includes a step of disposing a first metal foil on a first ceramic sheet, and pressurizing at a pressure of 1 to 20 MPa for a pressurizing time of 10 minutes to 30 hours under heating to a heating temperature of 150 to 260° C., so as to produce the first laminate, and the first ceramic sheet is a porous boron nitride sheet having voids filled with a semi-cured material of a thermosetting composition.

[12] The method of producing a circuit board according to the item [11], wherein the step of producing the first laminate includes pressurizing the first ceramic sheet having the first metal foil disposed thereon under heating in vacuum.

[13] The method of producing a circuit board according to the item or [12], wherein the step of producing the first laminate includes disposing the first ceramic sheet on a second metal foil, disposing the first metal foil on the first ceramic sheet disposed on the second metal foil, and pressurizing under heating, so as to produce the first laminate further including a second metal layer laminated on the first ceramic layer.

[14] The method of producing a circuit board according to any one of the items [8] to [13], wherein the step of producing the second laminate includes disposing the second ceramic sheet on the first metal layer of the first laminate, further disposing a third metal foil on the second ceramic sheet, and pressurizing under heating, so as to produce the second laminate further including a third metal layer laminated on the second ceramic layer.

[15] The method of producing a circuit board according to any one of the items [8] to [14], wherein the method further includes a step of forming an opening in the second ceramic layer of the second laminate, so as to expose the first metal layer.

Advantageous Effects of Invention

The present invention can provide a circuit board having electrodes therein that has a good thermal conductivity and an excellent voltage resistance and a method of producing the same.

DESCRIPTION OF EMBODIMENTS

[Circuit Board]

Figure 1:
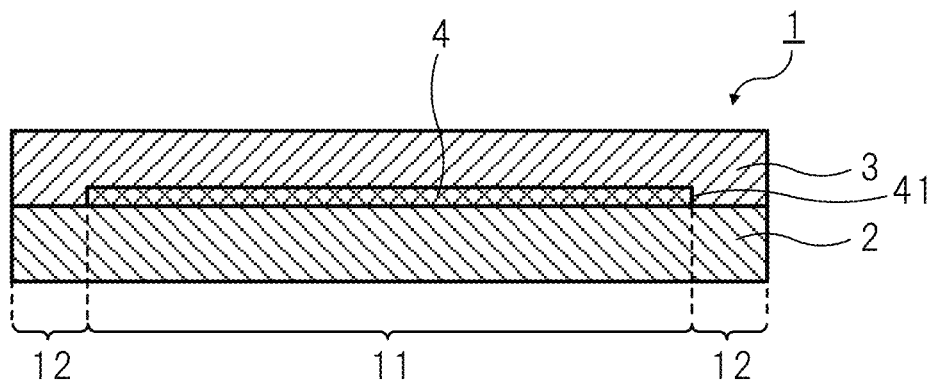
FIG. 1 is a schematic illustration of a circuit board according to one embodiment of the present invention.

A circuit board according to one embodiment of the present invention will be described with reference to FIG. 1. A circuit board 1 according to one embodiment of the present invention includes a first ceramic layer 2, a second ceramic layer 3 laminated on the first ceramic layer 2, and a first metal layer 4 disposed between the first ceramic layer 2 and the second ceramic layer 3.

(Second Ceramic Layer)

The second ceramic layer 3 is a porous boron nitride layer having voids filled with a cured material of a thermosetting composition. According to the configuration, the circuit board 1 can have an improved thermal conductivity.

<Porous Boron Nitride Layer>

The porous boron nitride layer has a structure having plural minute pores (which may be hereinafter referred to as "fine pores") formed therein. At least a part of the fine pores in the porous boron nitride layer may be connected to each other to form continuous pores.

The porous boron nitride layer may be preferably formed of a sintered material of an insulating material containing boron nitride, and may be more preferably formed of a boron nitride sintered material. The porous boron nitride layer may be a material including boron nitride primary particles sintered to each other. The boron nitride used in the porous boron nitride layer may be either amorphous boron nitride or hexagonal boron nitride. The porous boron nitride layer may be formed through reaction of a boron-containing compound, such as boric acid, boron oxide, and borax, and a nitride-containing compound, such as urea and melamine. The boron nitride porous material may also be formed by baking hexagonal boron carbonitride (h-$B_4CN_4$).

The thermal conductivity of boron nitride constituting the porous boron nitride layer may be, for example, 30 W/(m·K) or more, 50 W/(m·K) or more, or 60 W/(m·K) or more. The porous boron nitride layer is constituted by boron nitride excellent in thermal conductivity, and thereby the thermal resistance of the porous boron nitride layer having voids filled with a cured material of a thermosetting composition can be reduced. The thermal conductivity of boron nitride constituting the porous boron nitride layer is measured by the laser flash method for a specimen obtained by molding boron nitride constituting the porous boron nitride layer to 10 mm in length×10 mm in width×1 mm in thickness.

The average pore diameter of the fine pores of the porous boron nitride layer may be, for example, 0.5 μm or more, and is preferably 0.6 μm or more, more preferably 0.8 μm or more, and further preferably 1 μm or more, from the standpoint of the ability to fill the fine pores favorably with a thermosetting composition. The average pore diameter of the fine pores is preferably 4.0 μm or less, 3.0 μm or less, 2.5 μm or less, 2.0 μm or less, or 1.5 μm or less, from the standpoint of the enhancement of the insulation of the porous boron nitride layer.

The average pore diameter of the fine pores of the porous boron nitride layer is defined as the fine pore diameter at which the cumulative fine pore volume reaches 50% of the total fine pore volume in the fine pore distribution (abscissa: fine pore diameter, ordinate: cumulative fine pore volume) measured with a mercury porosimeter. The mercury porosimeter used may be a mercury porosimeter available from Shimadzu Corporation, and the measurement may be performed under pressurization by increasing the pressure from 0.03 atm to 4,000 atm.

The proportion of the voids occupied in the porous boron nitride layer (porosity) is preferably 10% by volume or more, 20% by volume or more, or 30% by volume or more, from the standpoint of the favorable achievement of the enhancement of the strength of the porous boron nitride layer having voids filled with a cured material of a thermosetting composition, and is preferably 70% by volume or less, more preferably 60% by volume or less, and further preferably 50% by volume or less, from the standpoint of the enhancement of the insulation and the thermal conductivity of the porous boron nitride layer having voids filled with a cured material of a thermosetting composition, all based on the apparent total volume of the porous boron nitride layer. The proportion (porosity) is calculated from the bulk density $D1$ (g/cm$^3$) obtained from the apparent volume and the mass of the porous boron nitride constituting the porous boron nitride layer, and the theoretical density $D2$ (2.28 g/cm$^3$) of boron nitride, according to the following expression.

$$\text{Porosity}(\% \text{ by volume}) = [1 - (D1/D2)] \times 100$$

<Thermosetting Composition>

The thermosetting composition is not particularly limited, as far as being a composition containing a compound having a thermosetting property, and is preferably a composition containing an epoxy compound and a cyanate compound.

The epoxy compound used may be a compound that has a desired viscosity as a semi-cured material or a viscosity suitable for impregnation in impregnating the porous boron nitride therewith. Examples thereof include 1,6-bis(2,3-epoxypropan-1-yloxy)naphthalene, a bisphenyl A type epoxy resin, a bisphenol F type epoxy resin, and a dicyclopentadiene type epoxy resin. Among these, 1,6-bis(2,3-epoxypropan-1-yloxy)naphthalene is commercially available, for example, as HP-4032D (trade name, available from DIC Corporation). The commercially available products of the epoxy resin include EP-4000L, EP-4088L, and EP-3950 (trade names, all available from Adeka Corporation), EXA-850CRP (trade name, available from DIC Corporation), and jER807, jER152, YX8000, and YX8800 (trade names, all available from Mitsubishi Chemical Corporation). The epoxy compound used may be a compound having a vinyl group. Examples of the commercially available products of the epoxy compound having a vinyl group include TEPIC-FL and TEPIC-VL (trade names, all available from Nissan Chemical Corporation), and MA-DGIC and DA-MGIC (trade names, all available from Shikoku Chemicals Corporation).

The content of the epoxy compound is preferably 30% by mass or more, more preferably 40% by mass or more, and further preferably 50% by mass or more, and is preferably 85% by mass or less, more preferably 75% by mass or less, and further preferably 70% by mass or less, all based on the total amount of the thermosetting composition.

Examples of the cyanate compound include dimethylmethylenebis(1,4-phenylene) biscyanate and bis(4-cyanatophenyl)methane. Dimethylmethylenebis(1,4-phenylene) biscyanate is commercially available, for example, as TA-CN (trade name, available from Mitsubishi Gas Chemical Company, Inc.)

The content of the cyanate compound is preferably 5% by mass or more, more preferably 8% by mass or more, and further preferably 10% by mass or more, and is preferably 51% by mass or less, more preferably 40% by mass or less, and further preferably 30% by mass or less, all based on the total amount of the thermosetting composition.

In the method of producing a circuit board described layer, the porous boron nitride sheet having voids filled with a semi-cured material of the thermosetting composition is used. Therefore, it is preferred that the thermosetting composition can be retained in a semi-cured state having a desired viscosity. From this standpoint, the equivalent ratio ((epoxy group equivalent)/(cyanato group equivalent)) of the epoxy group of the epoxy compound with respect to the cyanato group of the cyanate compound contained in the thermosetting composition is preferably 1.0 or more. The equivalent ratio is more preferably 1.5 or more, further preferably 2.0 or more, and still further preferably 2.5 or more, and from the standpoint of the promotion of the impregnation of the thermosetting composition and the standpoint of the achievement of the porous boron nitride sheet having voids filled with a semi-cured material of the thermosetting composition excellent in heat resistance, is preferably 6.0 or less, 5.5 or less, 5.0 or less, 4.5 or less, 4.0 or less, 3.5 or less, or 3.0 or less.

The thermosetting composition may further contain an additional compound having a thermosetting property other than the epoxy compound and the cyanate compound.

The thermosetting composition may further contain a curing agent separately from the epoxy compound and the cyanate compound from the standpoint of the further promotion of retention of the semi-cured state having a desired viscosity. In one embodiment, the thermosetting composition contains a curing agent for the epoxy compound. The curing agent for the epoxy compound is a compound that forms a crosslinked structure with the epoxy compound.

The curing agent for the epoxy compound preferably contains at least one kind selected from the group consisting of a benzoxazine compound, an ester compound, and a phenol compound.

Examples of the benzoxazine compound include a bisphenol F type benzoxazine compound. The bisphenol F type benzoxazine is commercially available, for example, as F-a type Benzoxazine (trade name, available from Shikoku Chemicals Corporation).

Examples of the ester compound include diphenyl phthalate and benzyl 2-ethylhexyl phthalate. The ester compound may be an active ester compound. The active ester compound means a compound that has one or more ester bond in the structure, and aromatic rings bonded to both sides of the ester bond.

Examples of the phenol compound include phenol, cresol, bisphenol A, bisphenol F, a phenol novolak resin, a cresol novolak resin, a dicyclopentadiene-modified phenol resin, a terpene-modified phenol resin, a triphenolmethane type resin, a phenol-aralkyl resin (having a phenylene skeleton, a biphenylene skeleton, or the like), a naphthol-aralkyl resin, and an allylphenol resin. These may be used alone, or as a mixture of two or more kinds thereof. The phenol compound is commercially available, for example, as TD2131 and VE14150 (trade names, available from DIC Corporation), and MEHC-7851M, MEHC-7500, MEH8005, and MEH8000H (trade names, available from Meiwa Plastic Industries, Ltd.)

In the case where the thermosetting composition contains the curing agent for the epoxy compound, the content of the curing agent is preferably 0.1% by mass or more, more preferably 5% by mass or more, and further preferably 7% by mass or more, and is preferably 30% by mass or less, more preferably 20% by mass or less, and further preferably 15% by mass or less, all based on the total amount of the thermosetting composition.

The thermosetting composition may further contain a curing accelerator in addition to the compounds described above. The curing accelerator contains a component functioning as a catalyst of the curing reaction (i.e., a catalyst type curing agent). The curing accelerator contained in the thermosetting composition can facilitate the reaction of the epoxy compound and the cyanate compound, the self-polymerization reaction of the epoxy compound, and/or the reaction of the epoxy compound and the curing agent for the epoxy compound, described later, and can also facilitate the retention of the semi-cured state having a desired viscosity of the semi-cured material. Examples of the component include an organic metal salt, a phosphorus compound, an imidazole derivative, an amine compound, and a cation polymerization initiator. One kind of the curing accelerator may be used alone, or two or more kinds thereof may be used in combination.

Examples of the organic metal salt include bis(2,4-pentanedionato)zinc(II), zinc octylate, zinc naphthenate, cobalt naphthenate, copper naphthenate, iron(III) acetylacetonate, nickel octylate, and manganese octylate.

Examples of the phosphorus compound include tetraphenylphosphonium tetra-p-tolyl borate, tetraphenylphosphonium tetraphenyl borate, triphenylphosphine, tri-p-tolylphosphine, tris(4-chlorophenyl)phosphine, tris(2,6-dimethoxyphenyl)phosphine, triphenylphosphine triphenylborane, tetraphenylphosphonium dicyanamide, and tetraphenylphosphonium (4-methylphenyl) borate.

Examples of the imidazole derivative include 1-(1-cyanomethyl)-2-ethyl-4-methyl-1H-imidazole, 2-ethyl-4-methylimidazole, 2-methylimidazole, 2-phenylimidazole, 1-cyanoethyl-2-phenylimidazole, 2-phenyl-4,5-dihydroxymethylimidazole, 2-phenyl-4-methyl-5-hydroxymethylimidazole, and 2,4,5-triphenylimidazole.

Examples of the amine compound include dicyandiamide, triethylamine, tributylamine, tri-n-octylamine, 1,4-diazabicyclo[2.2.2]octane, 1,8-diazabicyclo[5.4.0]undec-7-ene, benzyldimethylamine, 4-methyl-N,N-dimethylbenzylamine, 2,4,6-tris(dimethylaminomethyl)phenol, and 4-dimethylaminopyridine.

Examples of the cation polymerization initiator include a benzylsulfonium salt, a benzylammonium salt, a benzylpyridinium salt, a benzylphosphonium salt, a hydrazinium salt, a carboxylate ester compound, a sulfonate ester compound, an amine imide, an antimony pentachloride-acetyl chloride complex, and diaryl iodonium salt-dibenzyloxy copper.

The content of the curing accelerator may be 0.001 part by mass or more, 0.01 part by mass or more, or 0.05 part by mass or more, and may be 1 part by mass or less, 0.8 part by mass or less, 0.5 part by mass or less, 0.3 part by mass or less, or 0.1 part by mass or less, per 100 parts by mass in total of the epoxy compound, the cyanate compound, and the curing gent for the epoxy compound. The content thereof within the range can facilitate the retention of the semi-cured material to a desired viscosity.

<Thickness of Second Ceramic Layer>

The thickness of the second ceramic layer may be changed depending on the demanded characteristics. For example, in the case where the thermal resistance is important, but the voltage resistance is not especially important, a small thickness of 0.1 to 0.35 mm may be used, and on the other hand, in the case where the voltage resistance and the partial discharge characteristics are important, a large thickness of 0.35 to 1.0 mm may be used.

<Voltage Resistance of Second Ceramic Layer>

Figure 8:
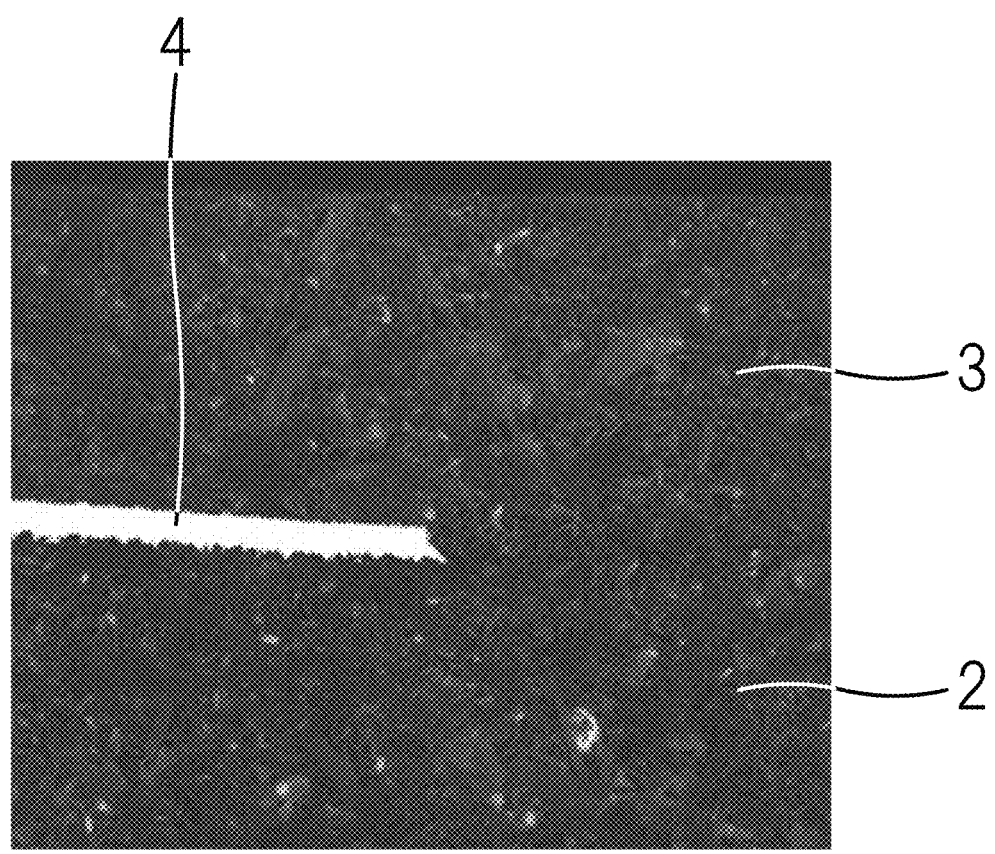
FIG. 8 is the SEM image of the region in the vicinity of the side surface of the first metal layer on the cross section of the circuit board 5.

The voltage resistance of the second ceramic layer 3 measured according to JIS C2110 is preferably 5.0 kV AC or more. In the case where the voltage resistance of the second ceramic layer 3 is 5.0 kV AC or more, the reliability of the circuit board 1 can be further improved. From this standpoint, the voltage resistance of the second ceramic layer 2 measured according to JIS C2110 is preferably 10.0 kV AC or more. For example, the voltage resistance of the second ceramic layer 3 can be 5.0 kV AC or more by joining the first ceramic layer 2 and the second ceramic layer 3 to with each other in the metal layer non-existing zone 12. Furthermore, the voltage resistance of the second ceramic layer 3 can be further improved by sufficiently joining the side surface 41 of the first metal layer 4 and the second ceramic layer 3 to each other. The first ceramic layer 2 and the second ceramic layer 3 are preferably joined to each other without gaps in the metal layer non-existing zone, and may be joined at a joining ratio of 70% or more, 80% or more, 90% or more, or 95% or more. The joining ratio is the ratio of the joined length with respect to the total length of one joining interface (i.e., the length of the straight line drawn in parallel to the bottom surface of the metal layer from one end of the metal layer to the end of the circuit board) in an SEM image as shown in FIG. 8. The ratio is measured for five measurement fields, and the average thereof is used.

(First Ceramic Layer)

The first ceramic layer 2 is not particularly limited, as far as being a layer of a ceramic material that is used as a material of a ceramic board. Examples of the ceramic material used in the first ceramic layer 2 include alumina, forsterite, mullite, magnesia, spinel, steatite, beryllia, glass ceramics, aluminum nitride, silicon carbide, silicon nitride, and boron nitride. The ceramic material used in the first ceramic layer 2 may be a dense material or a porous material. In the case where the ceramic material is a porous material, the voids of the porous material are preferably filled with a resin. One kind of the ceramic material may be used alone, or two or more kinds thereof may be used in combination. Among the ceramic materials, the first ceramic layer 2 is preferably a porous boron nitride layer having voids filled with a cured material of a thermosetting composition from the standpoint of the thermal conductivity and the standpoint of the joinability to the second ceramic layer 3. The porous boron nitride and the thermosetting composition used in the first ceramic layer 2 and the porous boron nitride and the thermosetting composition used in the second ceramic layer 3 may be the same as or different from each other respectively. However, the porous boron nitride and the thermosetting composition used in the first ceramic layer 2 and the porous boron nitride and the thermosetting composition used in the second ceramic layer 3 are preferably the same as each other respectively from the standpoint of the joinability to the second ceramic layer 3.

<Thickness of First Ceramic Layer>

The thickness of the first ceramic layer 2 may be changed depending on the demanded characteristics. For example, in the case where the thermal resistance is important, but the voltage resistance is not especially important, a small thickness of 0.1 to 0.35 mm may be used, and on the other hand, in the case where the voltage resistance and the partial discharge characteristics are important, a large thickness of 0.35 to 1.0 mm may be used.

<Voltage Resistance of First Ceramic Layer>

The voltage resistance of the first ceramic layer 2 measured according to JIS C2110 is preferably 5.0 kV AC or more. In the case where the voltage resistance of the first ceramic layer 2 is 5.0 kV AC or more, the reliability of the circuit board 1 can be further improved. From this standpoint, the voltage resistance of the first ceramic layer 2 measured according to JIS C2110 is preferably 10.0 kV AC or more.

<Porous Boron Nitride Layer and Thermosetting Composition of First Ceramic Layer>

In the case where the first ceramic layer 2 is a porous boron nitride layer having voids filled with a cured material of a thermosetting composition, the first ceramic layer 2 has the similar configuration as the second ceramic layer 3. Accordingly, the descriptions for the porous boron nitride layer and the thermosetting composition in the first ceramic layer 2 are omitted herein.

(First Metal Layer)

The first metal layer 4 is disposed between the first ceramic layer 2 and the second ceramic layer 3. According to the configuration, a circuit can be formed with the first metal layer 4 inside the circuit board 1. In the case where a circuit is formed on the surface of the circuit board 1, a noise shield for suppressing the influence of noise on the circuit can be formed inside the circuit board 1. In the case where a wiring line is formed on the surface of the circuit board 1, furthermore, the wiring line formed on the surface of the circuit board 1 and the first metal layer 4 can be disposed to face closely each other with the second ceramic layer 3 intervening therebetween, and thereby the inductance of the wiring line formed on the surface of the circuit board 1 can be reduced.

The metal used in the first metal layer 4 is not particularly limited, as far as the metal has a high electroconductivity. Examples of the metal used in the first metal layer 4 include copper, aluminum, nickel, iron, tin, gold, silver, molybdenum, titanium, and stainless steel. One kind of the metal may be used alone, or two or more kinds thereof may be used in combination. Among these metals, copper and aluminum are preferred, and copper is more preferred, from the standpoint of the electroconductivity and the standpoint of the cost.

The thickness of the first metal layer 4 is preferably ¼ or less of the thickness of the second ceramic layer 3. In the case where the thickness of the first metal layer 4 is ¼ or less of the thickness of the second ceramic layer 3, the second ceramic layer 3 can be easily deformed along the step occurring at the boundary between the zone having the first metal layer 4 existing therein and the zone having no first metal layer 4 existing therein. From this standpoint, the thickness of the first metal layer 4 is more preferably ⅕ or less, and further preferably ⅙ or less, of the thickness of the second ceramic layer 3. The thickness of the first metal layer 4 is preferably 5 μm or more, more preferably 10 μm or more, and further preferably 20 μm or more, from the standpoint of the reduction of the electric resistance of the first metal layer 4.

The side surface 41 of the first metal layer 4 is preferably covered with the second ceramic layer 3. According to the configuration, the voltage resistance of the circuit board 1 can be further improved. From the standpoint of the voltage resistance of the circuit board 1, no gap preferably exists between the side surface 41 of the first metal layer 4 and the second ceramic layer 3, and for example, gaps that can be confirmed in an SEM image obtained with a scanning electron microscope (SEM) at a magnification of 100 preferably do not exist.

As the second ceramic layer 3 is a porous material of hard boron nitride, there is a concern that large gaps occur between the first ceramic layer 2 and the second ceramic layer 3 in the metal layer non-existing zone 12 due to the step on the second ceramic layer 3 at the boundary between the metal layer existing zone 11 and the metal layer non-existing zone 12. In the circuit board 1 according to one embodiment of the present invention, however, large gaps are prevented from occurring between the metal layer existing zone 11 and the metal layer non-existing zone 12 by regulating the pressurizing condition in laminating the first ceramic layer 2 and the second ceramic layer 3. As a result, the voltage resistance of the circuit board 1 is improved, and the side surface 41 of the first metal layer 4 is covered with the second ceramic layer 3.

The area in the plane view of the first metal layer 4 is preferably smaller than the area in the plane view of the second ceramic layer 3. The first metal layer 4 may be disposed at the center of the second ceramic layer 3 while the edges of the first metal layer 4 are spaced from the edges of the second ceramic layer 3, and thereby the metal layer existing zone 11 and the metal layer non-existing zone 12 described later are allowed to exist in the circuit board 1. For example, the area in the plane view of the first metal layer 4 is preferably 10 to 90% of the area in the plane view of the second ceramic layer 3.

The ten-point average roughness (Rz) of the surfaces on both sides of the first metal layer 4 is preferably 1.0 to 20 µm. In the case where the ten-point average roughness (Rz) of the surfaces on both sides of the first metal layer 4 is 1.0 µm or more, the joint between the first metal layer 4, and the first ceramic layer 2 and the second ceramic layer 3 can be further strengthened. In the case where the ten-point average roughness (Rz) of the surfaces on both sides of the first metal layer 4 is 20 µm or less, the occurrence of defects in the first ceramic layer 2 and the second ceramic layer 3 due to the surface roughness of the first metal layer 4 can be suppressed. From this standpoint, the ten-point average roughness (Rz) of the surfaces on both sides of the first metal layer 4 is more preferably 2.0 to 15 µm, and further preferably 3.0 to 12 µm. For example, the use of a copper foil having a ten-point average roughness (Rz) of the surfaces on both sides thereof of 1.0 to 20 µm enables the formation of the first metal layer 4 having a ten-point average roughness (Rz) of the surfaces on both sides thereof of 1.0 to 20 µm in the circuit board 1. In the case where a copper foil having a ten-point average roughness (Rz) of an S-surface (shiny surface) and a ten-point average roughness (Rz) of an M-surface (mat surface) that are different from each other, as in an electrolytic copper foil, is used, it is possible that a copper foil having a ten-point average roughness (Rz) of the M-surface of 1.0 to 20 µm is used as the first metal layer 4, and the S-surface thereof is subjected to a roughening treatment to make the ten-point average roughness (Rz) of the S-surface within a range of 1.0 to 20 µm. The ten-point average roughness (Rz) is a value that is measured according to JIS B0601:1994.

(Metal Layer Existing Zone and Metal Layer Non-Existing Zone)

The circuit board 1 according to one embodiment of the present invention has, in the plane view, the metal layer existing zone 11 having the first metal layer 4 existing between the first ceramic layer 2 and the second ceramic layer 3, and the metal layer non-existing zone 12 having no first metal layer 4 existing between the first ceramic layer 2 and the second ceramic layer 3, and the first ceramic layer 2 and the second ceramic layer 3 are joined to each other in the metal layer non-existing zone 12. If the first ceramic layer 2 and the second ceramic layer 3 are not joined to each other in the metal layer non-existing zone 12, insulation breakdown occurs thereby, resulting in the deterioration of the voltage resistance of the second ceramic layer 3, and consequently the voltage resistance of the circuit board 1 is also deteriorated. The state that the first ceramic layer 2 and the second ceramic layer 3 are joined to each other has been described above.

(Modified Examples of Circuit Board)

The circuit board 1 according to one embodiment of the present invention may be modified as follows.

Modified Example 1

Figure 2:
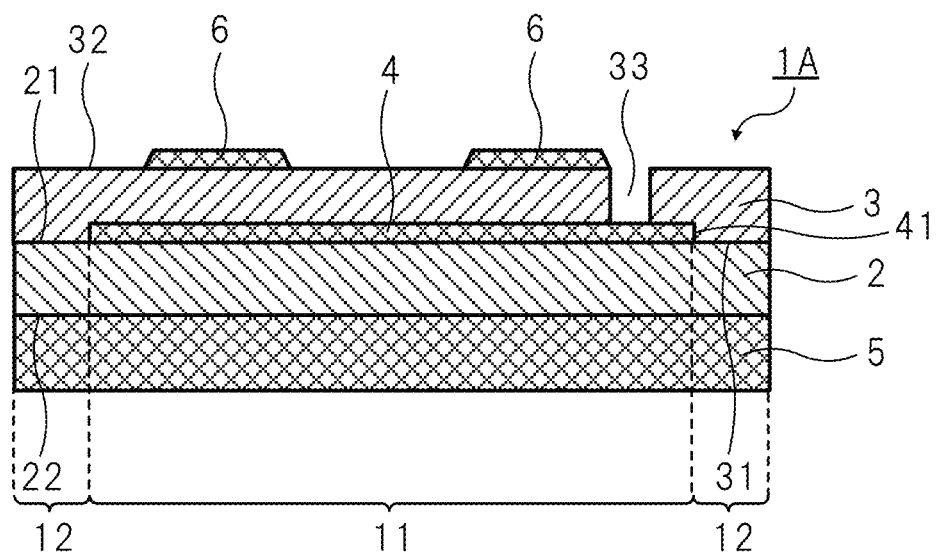
FIG. 2 is a schematic illustration of a circuit board according to a modified example of one embodiment of the present invention.

As shown in FIG. 2, a circuit board 1A of a modified example according to one embodiment of the present invention may include a second metal layer 5 that is joined to the surface 22 of the first ceramic layer 2 opposite to the surface 21 thereof on the side of the second ceramic layer 3. According to the configuration, the circuit board 1A can be joined to a heat radiation base plate with solder, and thereby the thermal conductivity between the circuit board 1A and the heat radiation base plate can be enhanced, and simultaneously the reliability of the joint between the circuit board 1A and the heat radiation base plate can also be enhanced. Furthermore, the strength of the circuit board 1A can be improved by the second metal layer 5.

The second metal layer 5 is preferably a layer of copper or aluminum from the standpoint of the thermal conductivity of the second metal layer 5 and the standpoint of the cost of the second metal layer 5. The thickness of the second metal layer 5 is preferably 0.1 to 5.0 mm, more preferably 0.2 to 3.0 mm, and further preferably 0.3 to 2.5 mm, from the standpoint of the improvement of the strength of the circuit board 1A. The second metal layer 5 is preferably a rolled copper foil having been recrystallized through a heat treatment from the standpoint of the improvement of the strength of the circuit board 1A.

Modified Example 2

As shown in FIG. 2, the circuit board 1A of the modified example according to one embodiment of the present invention may include a third metal layer 6 that is formed on the surface 32 of the second ceramic layer 3 opposite to the surface 31 thereof on the side of the first ceramic layer 2. According to the configuration, a circuit can be formed on the surface of the circuit board 1A, and a wiring line can be formed on the circuit board 1A for mounting a semiconductor device thereon. The circuit board 1A of the modified example according to one embodiment of the present invention is significantly excellent in heat radiation capability, and therefore the semiconductor device mounted on the circuit board 1A is preferably a power semiconductor device. Examples of the power semiconductor device include an Si power semiconductor device, an SiC power semiconductor device, and a GaN power semiconductor device. There is a demand in recent years that the inductance of the wiring line formed on the surface of the circuit board 1A is reduced for a high-speed operation of the power semiconductor device. The circuit board 1A enables the wiring lines to be disposed to face closely each other as described above, and thereby the inductance of the wiring line formed on the surface of the circuit board 1A can be reduced.

The third metal layer 6 is preferably a layer of copper or aluminum, more preferably copper, and further preferably an electrolytic copper foil or a rolled copper foil having been recrystallized through a heat treatment, from the standpoint of the thermal conductivity of the third metal layer 6 and the standpoint of the cost of the third metal layer 6. The thickness of the third metal layer 6 is preferably 0.01 to 2.0 mm, more preferably 0.02 to 0.8 mm, and further preferably 0.035 to 0.5 mm. The ten-point average roughness (Rz) of the surface of the third metal layer 6 on the side of the second ceramic layer 3 is preferably 1.0 to 20 μm, and more preferably 3.0 to 17 μm, from the standpoint of the joinability to the second ceramic layer 3 and the standpoint of the suppression of the occurrence of defects in the second ceramic layer 3.

Modified Example 3

As in the circuit board 1A of the modified example according to one embodiment of the present invention shown in FIG. 2, the second ceramic layer 3 may have an opening 33, and thereby the first metal layer 4 can be exposed in the opening 33. According to the configuration, the first metal layer 4 and a metal layer formed on the surface of the circuit board 1A can be electrically connected by filling the interior of the opening 33 by metal plating. The shape in the plane view of the opening 33 may be a circular shape or may be a rectangular shape. In the case where the shape in the plane view of the opening 33 is a circular shape, the diameter of the opening 33 is preferably 0.3 to 3 mm, and more preferably 0.5 to 2 mm. In the case where the shape in the plane view of the opening 33 is a rectangular shape, the length of one edge of the opening 33 is preferably 0.5 to 10 mm, and more preferably 1.0 to 5.0 mm.

The circuit board 1 according to one embodiment of the present invention and the circuit board 1A of the modified example according to one embodiment of the present invention are only examples of the circuit board of the present invention. Therefore, the circuit board of the present invention is not limited to the circuit board 1 according to one embodiment of the present invention and the circuit board 1A of the modified example according to one embodiment of the present invention.

[Method of Producing Circuit Board]

A method of producing a circuit board according to one embodiment of the present invention will be described with reference to FIG. 3.

A method of producing a circuit board according to one embodiment of the present invention includes a step (A) of disposing a first metal foil 104 on a first ceramic sheet 102, and pressurizing under heating to produce a first laminate 111 including a first ceramic layer 2 and a first metal layer 4 laminated on the first ceramic layer 2, a step (B) of disposing a photoresist 71 on the first metal layer 4 of the first laminate 111, and then etching the first metal layer 4 to pattern the first metal layer 4, and step (C) of disposing a second ceramic sheet 103 on the first metal layer 4 of the first laminate 111, and pressurizing under heating to produce a second laminate 112 including the first ceramic layer 2, a second ceramic layer 3 laminated on the first ceramic layer 2, and the first metal layer 4 disposed between the first ceramic layer 2 and the second ceramic layer 3. The steps will be described in detail below.

(Step (A))

Figure 3:
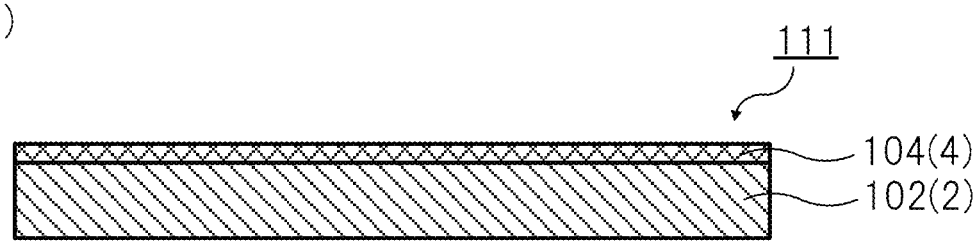
FIGS. 3(a) to 3(e) are schematic illustrations for describing a method of producing a circuit board according to one embodiment of the present invention.
Figure 3:
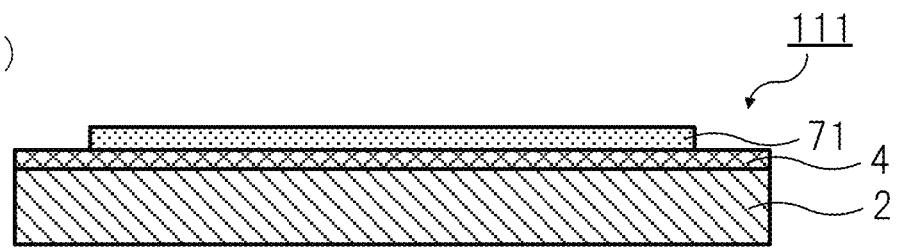
Figure 3:
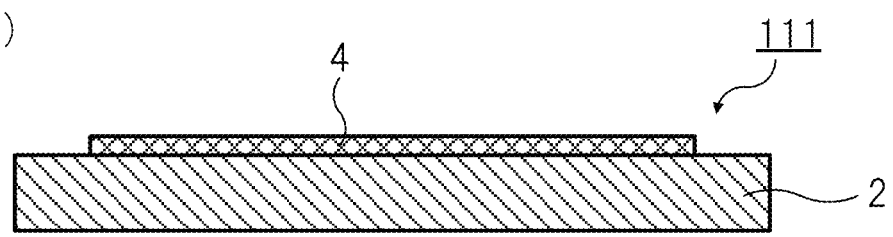
Figure 3:
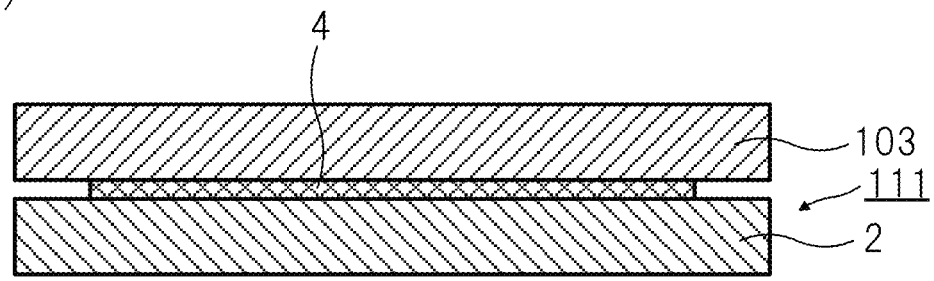
Figure 3:
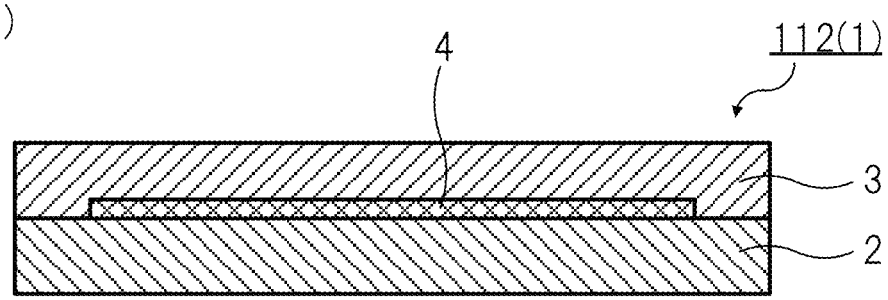

In the step (A), as shown in FIG. 3(*a*), a first metal foil 104 is disposed on a first ceramic sheet 102. The first ceramic sheet 102 and the first metal foil 104 disposed thereon are then pressurized under heating, so as to produce a first laminate 111 including a first ceramic layer 2 and a first metal layer 4 laminated on the first ceramic layer 2.

<First Ceramic Sheet>

The first ceramic sheet 102 is not particularly limited, as far as being a sheet of a ceramic material that is used as a material of a ceramic board. Examples of the ceramic material used in the first ceramic sheet 102 include the ceramic materials used in the first ceramic layer 2 described above. The ceramic material used in the first ceramic sheet 102 may be a dense material or a porous material. In the case where the ceramic material is a porous material, the voids of the porous material are preferably filled with a resin in a semi-cured state. Among the ceramic materials, the first ceramic sheet 102 is preferably a porous boron nitride sheet having voids filled with a semi-cured material of a thermosetting composition from the standpoint of the thermal conductivity and the standpoint of the joinability to the second ceramic sheet 103 described later. The porous boron nitride and the thermosetting composition used in the first ceramic sheet 102 and the porous boron nitride and the thermosetting composition used in the second ceramic sheet 103 may be the same as or different from each other respectively. However, the porous boron nitride and the thermosetting composition used in the first ceramic sheet 102 and the porous boron nitride and the thermosetting composition used in the second ceramic sheet 103 are preferably the same as each other respectively from the standpoint of the joinability to the second ceramic sheet 103.

<First Metal Foil>

The metal used in the first metal foil 104 is the same as the metal used in the first metal layer 4 described above, and therefore the description thereof is omitted herein. In the case where a copper foil is used as the first metal foil 104, an electrolytic copper foil is preferred since a fine pattern can be formed. The ten-point average roughness (Rz) of the surface and the thickness of the first ceramic sheet 102 are the same as the ten-point average roughness (Rz) of the surface and the thickness of the first ceramic layer 2 described above.

<Pressurizing Condition>

As the pressurizing condition in the step (A), the heating temperature is preferably 150 to 260° C., and more preferably 180 to 230° C., the pressure is preferably 0.1 to 5 MPa, and more preferably 0.3 to 2 MPa, and the pressurizing time is preferably 10 minutes to 30 hours, and more preferably 20 minutes to 15 hours, from the standpoint of the strong joint between the first ceramic sheet 102 and the first metal foil 104. In the case where the first ceramic sheet 102 is a porous boron nitride sheet having voids filled with a semi-cured material of a thermosetting composition, the semi-cured material, with which the voids of the porous boron nitride sheet is filled, can be cured under the pressurizing condition described above.

The first ceramic sheet 102 and the first metal foil 104 disposed thereon are preferably pressurized under heating in vacuum from the standpoint of the further strong adhesion of the first ceramic sheet 102 and the first metal foil 104. The pressure of the vacuum state in this case is preferably 5.0 kPa or less, and more preferably 3.0 kPa or less, in terms of absolute pressure.

(Step B)

In the step (B), as shown in FIG. 3(*b*), a patterned photoresist 71 is disposed on the first metal layer 4 of the first laminate 111. For example, the patterned photoresist 71 can be formed on the first metal layer 4 in such a manner that a dry film resist is laminated on the first metal layer 4 with a dry film laminator, which is then irradiated with UV light by using an exposing equipment having a photomask corresponding to the pattern of the photoresist 71, and the unnecessary part of the photoresist is dissolved and removed by using a developing equipment. Thereafter, the first metal layer 4 is patterned as shown in FIG. 3(c) in such a manner that the first metal layer 4 is etched with an etching solution to remove the unnecessary part of the first metal layer 4, and the photoresist 71 is removed. In the case where the material of the first metal layer 4 is copper, examples of the etching solution include an alkaline ammonia etching solution, a cupric chloride etching solution, a ferric chloride etching solution, a sulfuric acid-hydrogen peroxide etching solution, a peroxodisulfate etching solution, and a chromic acid-sulfuric acid mixture. Among these etching solutions, a sulfuric acid-hydrogen peroxide etching solution is preferred.

(Step C)

In the step (C), as shown in FIG. 3(d), a second ceramic sheet 103 is disposed on the first metal layer 4 of the first laminate 111. The first laminate 111 and the second ceramic sheet 103 disposed thereon are then pressurized under heating, so as to produce a second laminate 112 including the first ceramic layer 2, a second ceramic layer 3 laminated on the first ceramic layer 2, and the first metal layer 4 disposed between the first ceramic layer 2 and the second ceramic layer 3, as shown in FIG. 3(e).

<Second Ceramic Sheet>

The second ceramic sheet 103 is a porous boron nitride sheet having voids filled with a semi-cured material of a thermosetting composition. In the case where the thermosetting composition is a compound containing an epoxy compound or a cyanate compound, the porous boron nitride sheet is produced, for example, in the following manner.

The method of producing the second ceramic sheet 103 in the case where the thermosetting composition is a thermosetting composition containing an epoxy compound or a cyanate compound includes a step of impregnating a porous material with the thermosetting composition containing an epoxy compound and a cyanate compound (impregnating step), and a step of heating the porous material impregnated with the thermosetting composition to a temperature T1 at which the cyanate compound is reacted (semi-curing step). The embodiments of the thermosetting composition have been described above.

In the impregnating step, for example, a boron nitride porous material is firstly prepared. The boron nitride porous material may be produced through sintering or the like, or a commercially available product thereof may be used. The boron nitride porous material can be obtained, for example, by sintering boron nitride powder. The boron nitride porous material can also be obtained by baking a mixture of a boron-containing compound, such as boric acid, boron oxide, and borax, and a nitride-containing compound, such as urea and melamine, and can also be obtained by baking hexagonal boron carbonitride (h-$B_4CN_4$).

The boron nitride porous material can also be produced in such a manner that a slurry containing boron nitride powder is dried with a spray drier or the like to produce granules of boron nitride powder, and boron nitride powder is produced with the granules and then sintered. The molding may be performed by the mold press molding method or by the cold isostatic pressing (CIP) method.

The boron nitride powder may contain a sintering aid. Examples of the sintering aid include an oxide of a rare earth element, such as yttria (yttrium oxide), alumina (aluminum oxide), and magnesia (magnesium oxide), a carbonate salt of an alkali metal, such as lithium carbonate and sodium carbonate, and boric acid. In the case where the sintering aid is mixed in the boron nitride powder, the amount of the sintering aid mixed may be, for example, 0.01 part by mass or more, or 0.1 part by mass or more, per 100 parts by mass of the boron nitride powder. The amount of the sintering aid mixed may be 20 parts by mass or less, 15 parts by mass or less, or 10 parts by mass or less, per 100 parts by mass of the boron nitride powder. In the case where the amount of the sintering aid mixed is in the range, the average pore diameter of the boron nitride porous material can be regulated to the range of the average pore diameter of the second ceramic layer described above.

The baking temperature of the molded article of the boron nitride powder may be, for example, 1,600° C. or more or 1,700° C. or more. The baking temperature of the molded article of the boron nitride powder may be, for example, 2,200° C. or less or 2,000° C. or less. The baking time of the molded article of the boron nitride powder may be, for example, 1 hour or more and 30 hours or less. The atmosphere in baking may be, for example, an inert gas atmosphere, such as nitrogen, helium, and argon.

In baking the molded article of the boron nitride powder, for example, a batch type furnace, a continuous type furnace, or the like may be used. Examples of the batch type furnace include a muffle furnace, a tubular furnace, and an atmosphere furnace. Examples of the continuous type furnace include a rotary kiln, a screw conveyer furnace, a tunnel furnace, a belt furnace, a pusher furnace, and a small continuous furnace.

The boron nitride porous material obtained by baking the molded article of the boron nitride powder may be processed into a sheet form by cutting or the like into the desired shape and thickness depending on necessity before the impregnating step. The boron nitride porous material obtained by baking the molded article of the boron nitride powder may be a porous material in a sheet form.

In the impregnating step, subsequently, a solution containing the thermosetting composition is prepared inside the impregnating equipment, and the boron nitride porous material is immersed in the solution to impregnate the fine pores of the boron nitride porous material with the thermosetting composition.

The impregnating step may be performed under a reduced pressure condition or an increased pressure condition, and may also be performed under a combination of a reduced pressure condition or an increased pressure condition. The pressure inside the impregnating equipment in the case where the impregnating step is performed under a reduced pressure condition is, for example, 1,000 Pa or less, 500 Pa or less, 100 Pa or less, 50 Pa or less, or 20 Pa or less. The pressure inside the impregnating equipment in the case where the impregnating step is performed under an increased pressure condition is, for example, 1 MPa or more, 3 MPa or more, 10 MPa or more, or 30 MPa or more.

In impregnating the boron nitride porous material with the thermosetting composition, the solution containing the thermosetting composition may be heated. By heating the solution containing the thermosetting composition, the viscosity of the solution can be regulated to accelerate the impregnation of the boron nitride porous material. The temperature of heating the solution containing the thermosetting composition for impregnation may be a temperature exceeding the temperature T1 described later. The upper limit of the temperature of heating the solution containing the thermosetting composition may be a temperature T1+20° C. or less.

In the impregnating step, the boron nitride porous material is immersed in the solution containing the thermosetting composition, and retained in this state for a prescribed period of time. The prescribed period of time (i.e., the impregnating time) is not particularly limited, and may be, for example, 5 minutes or more, 30 minutes or more, 1 hour or more, 5 hours or more, 10 hours or more, 100 hours or more, or 150 hours or more.

In the semi-curing step, the boron nitride porous material impregnated with the thermosetting composition is heated to a temperature T1 at which the cyanate compound is reacted. According to the procedure, the cyanate compound contained in the thermosetting composition is reacted to provide a semi-cured material. At this time, the cyanate compound may be reacted by itself, or the cyanate compound and a part of the epoxy compound may be reacted. In the thermosetting composition, on the other hand, the equivalent ratio of the epoxy group of the epoxy compound with respect to the cyanato group of the cyanate compound is 1.0 or more as described above. Accordingly, the semi-cured material contains the epoxy compound excessively in terms of epoxy equivalent to the cyanate compound, and the epoxy compound remains uncured therein. As a result, the semi-cured material of the thermosetting composition is obtained.

The temperature T1 is preferably 70° C. or more, more preferably 80° C. or more, and further preferably 90° C. or more, from the standpoint of the sufficient impregnation of the porous material with the semi-cured material. The temperature T1 is preferably 180° C. or less, more preferably 150° C. or less, and further preferably 120° C. or less, from the standpoint of the reduction in viscosity change with time. The temperature T1 means the atmospheric temperature in heating the boron nitride porous material impregnated with the thermosetting composition.

The heating time in the semi-curing step may be 1 hour or more, 3 hours or more, or 5 hours or more, and may be 12 hours or less, 10 hours or less, or 8 hours or less.

The resulting porous boron nitride sheet having voids filled with the semi-cured material of the thermosetting composition (which may be hereinafter referred to as a semi-cured sheet) contains a part of the compounds (mainly the epoxy compound) that remain uncured, and therefore has better adhesiveness than a cured material obtained by completely curing the thermosetting composition. The semi-cured sheet retains the uncured state for a long period of time unless heating to a temperature at which the uncured compound is cured (which will be described in detail later), and therefore the desired viscosity excellent in adhesiveness to an adherend can be easily retained. Accordingly, the semi-cured sheet excellent in handleability can be obtained.

<Pressurizing Condition>

In pressurizing the first laminate 111 and the second ceramic sheet 103 disposed thereon under heating, the heating temperature is preferably 150 to 260° C., and more preferably 180 to 230° C., the pressure is preferably 1 to 20 MPa, and more preferably 5 to 15 MPa, and the pressurizing time is preferably 10 minutes to 30 hours, and more preferably 20 minutes to 15 hours. The lamination of the second ceramic sheet 103 under the pressurizing condition can strongly join the second ceramic sheet 103 to the first laminate 111 while preventing the occurrence of gaps between the first laminate 111 and the second ceramic sheet 103 due to the step caused by the first metal layer 4. The side surface 41 of the first metal layer 4 can be covered with the second ceramic layer 3. Furthermore, the heating temperature above is the temperature at which the epoxy compound undergoes self-polymerization reaction (i.e., reaction of the uncured epoxy compound itself), and therefore the semi-cured material, with which the voids of the porous boron nitride of the second ceramic sheet are filled, becomes a cured material under the pressurizing condition described above, resulting in the circuit board 1 according to one embodiment of the present invention.

Before the aforementioned pressurizing operation performed for the first laminate 111, the first laminate 111 and the second ceramic sheet 103 disposed thereon may be pressurized under heating to a temperature that is lower than the heating temperature for the aforementioned pressurization. According to the procedure, the thickness of the second ceramic sheet 103 can be regulated. In preliminarily pressurizing before the aforementioned pressurizing operation, the heating temperature is preferably 100 to 200° C., and more preferably 120 to 180° C., the pressure is preferably 1 to 20 MPa, and more preferably 5 to 15 MPa, and the pressurizing time is preferably 10 minutes to 30 hours, and more preferably 20 minutes to 15 hours.

The first laminate 111 and the second ceramic sheet 103 disposed thereon are preferably pressurized under heating in vacuum from the standpoint of the further strong adhesion of the second ceramic sheet 103 and the first laminate 111. According to the procedure, the occurrence of gaps between the first laminate 111 and the second ceramic sheet 103 due to the step caused by the first metal layer 4 can be further prevented. The pressure of the vacuum state in this case is preferably 5 kPa or less, and more preferably 3 kPa or less, in terms of absolute pressure.

(Modified Examples of Method of Producing Circuit Board)

The method of producing a circuit board according to one embodiment of the present invention can be modified as follows.

Modified Example 1

The method of producing a circuit board according to one embodiment of the present invention may include a step of roughening the surface of the first metal layer 4 of the first laminate 111. According to the procedure, the first metal layer 4 and the second ceramic sheet 103 can be further strongly joined to each other. From this standpoint, the ten-point average roughness (Rz) of the surface of the first metal layer 4 after roughening is preferably 1 to 20 μm, more preferably 2 to 15 μm, and further preferably 3 to 13 μm. Examples of the treatment for roughening the surface of the first metal layer 4 include a black oxidation treatment, a black reduction treatment, a microetching treatment, and an NBD treatment.

Modified Example 2

Figure 4:
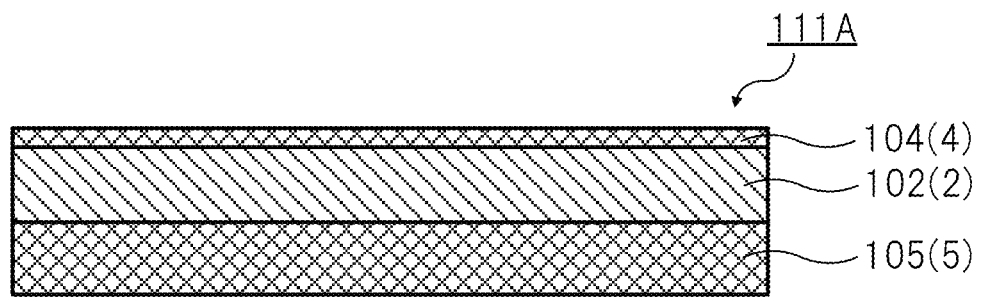
FIG. 4 is a schematic illustration for describing a method of producing a circuit board according to a modified example of one embodiment of the present invention.

As shown in FIG. 4, the step (A) may be performed in such a manner that the first ceramic sheet 102 is disposed on a second metal foil 105, and the first metal foil 104 is disposed on the first ceramic sheet 102 disposed on the second metal foil 105, which are then pressurized under heating. As a result, the first laminate 111A further includes a second metal layer 5 laminated on the first ceramic layer 2. According to the configuration, a circuit board 1A including the second metal layer 5 joined to the surface 22 of the first ceramic layer 2 opposite to the surface 21 thereof on the side of the second ceramic layer 3 can be produced (see FIG. 2).

Modified Example 3

Figure 5:
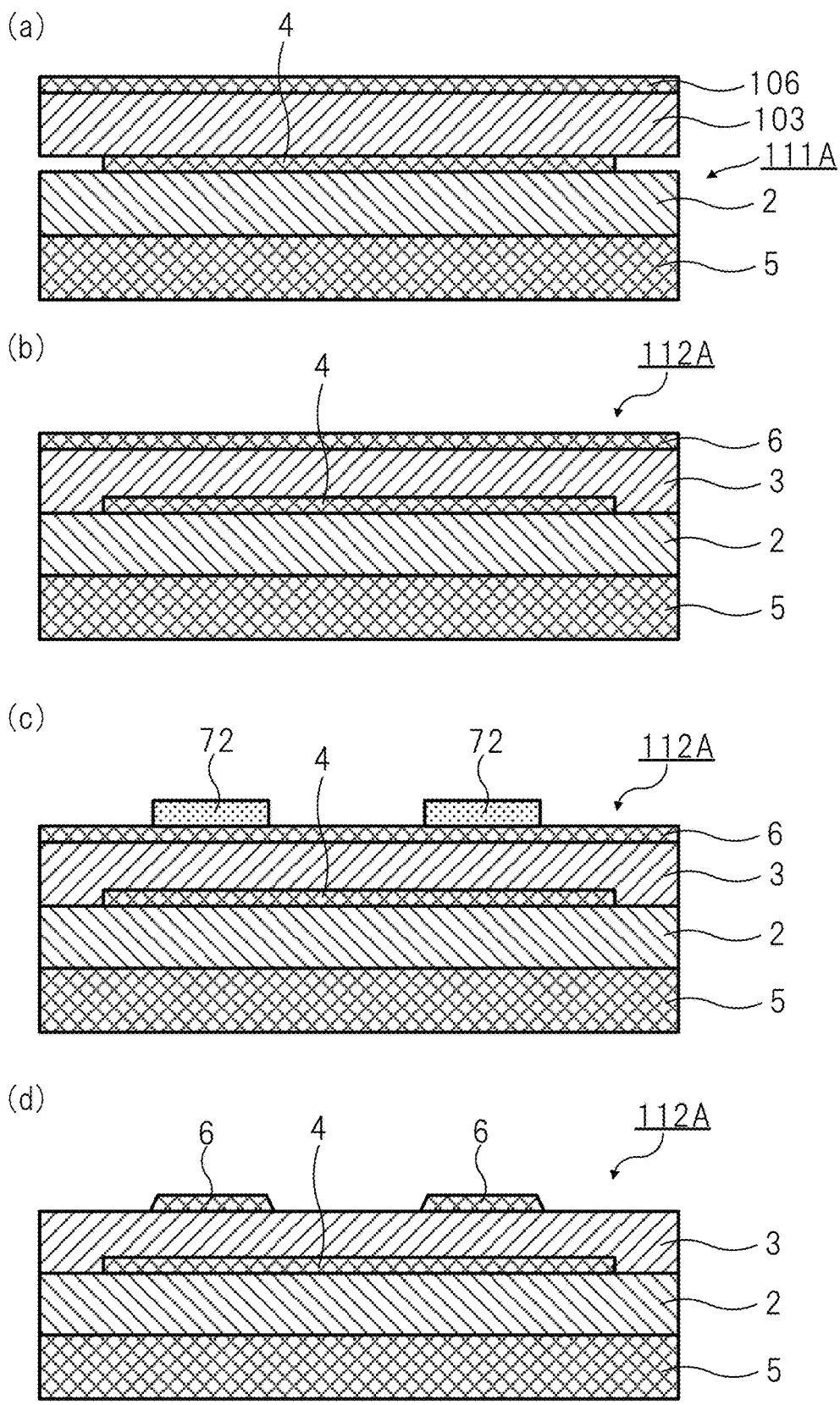
FIGS. 5(a) to 5(d) are schematic illustrations for describing a method of producing a circuit board according to a modified example of one embodiment of the present invention.

As shown in FIG. 5(a), the step (C) may be performed in such a manner that a second ceramic sheet 103 is disposed on the first metal layer 4 of the first laminate 111A, and a third metal foil 106 is further disposed on the second ceramic sheet 103, which are then pressurized under heating, and thereby a second laminate 112A further including a third metal layer 6 laminated on the second ceramic layer 3 may be produced, as shown in FIG. 5(*b*). According to the configuration, a circuit board 1A including the third metal layer 6 formed on the surface 32 of the second ceramic layer 3 opposite to the surface 31 thereof on the side of the first ceramic layer 2 can be produced (see FIG. 2).

In this case, the method of producing a circuit board according to one embodiment of the present invention may include a step of pattering the third metal layer 6, as shown in FIG. 5(*d*), in such a manner that a patterned photoresist 72 is disposed on the third metal layer 6 of the second laminate 112A, as shown in FIG. 5(*c*), and the third metal layer 6 is etched with an etching solution to remove the unnecessary part of the third metal layer 6, followed by removing the photoresist 72. According to the procedure, a circuit board 1A having a circuit or a wiring line formed with the third metal layer 6 formed on the surface thereof can be produced (see FIG. 2).

Modified Example 4

Figure 6:
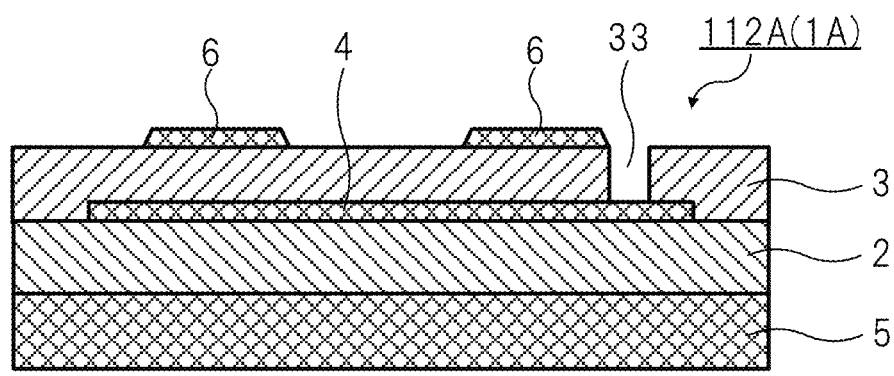
FIG. 6 is a schematic illustration for describing a method of producing a circuit board according to a modified example of one embodiment of the present invention.

As shown in FIG. 6, the method of producing a circuit board according to one embodiment of the present invention may include a step of forming an opening 33 in the second ceramic layer 3 of the second laminate 112A, so as to expose the first metal layer 4. According to the configuration, a circuit board 1A having the second ceramic layer 3 that has the opening 33, and the first metal layer 4 that is exposed in the opening 33 can be produced (see FIG. 2). For example, the opening 33 can be formed in the second ceramic layer 3 by a working method, such as a drilling method, a punching method, and a laser method. Among these working methods, a laser method is preferred from the standpoint of the microfabrication capability and the standpoint of the productivity. Examples of the laser working equipment used in the laser method include a carbon dioxide gas laser working machine, a YAG laser working machine, an excimer laser working machine. Among these laser working machines, a carbon dioxide gas laser working machine is preferred.

The method of producing a circuit board of the present invention is not limited to the methods of producing a circuit board according to one embodiment of the present invention and the methods of producing a circuit board according to the modified examples of one embodiment of the present invention, as far as the method includes a step of disposing a second ceramic sheet on a first metal layer of a first laminate including a first ceramic layer and the first metal layer laminated on the first ceramic layer, and pressurizing at a pressure of 5 to 15 MPa for a pressurizing time of 10 minutes to 30 hours under heating to a heating temperature of 150 to 260° C., so as to produce a second laminate including the first ceramic layer, a second ceramic layer laminated on the first ceramic layer, and a first metal layer disposed between the first ceramic layer and the second ceramic layer, and the second ceramic sheet is a porous boron nitride sheet having voids filled with a semi-cured material of a thermosetting composition.

EXAMPLES

The present invention will be described in detail with reference to examples below. The present invention is not limited to the examples.

[Production of Porous Boron Nitride Sheet Having Voids Filled with Semi-Cured Material of Thermosetting Composition]
(Production of Boron Nitride Porous Material)

40.0% by mass of amorphous boron nitride powder (available from Denka Co., Ltd., oxygen content: 1.5%, boron nitride purity: 97.6%, average particle diameter: 6.0 μm) and 60.0% by mass of hexagonal boron nitride powder (available from Denka Co., Ltd., oxygen content: 0.3%, boron nitride purity: 99.0%, average particle diameter: 30.0 μm) each were weighed in a vessel, to which a sintering aid (boric acid and calcium carbonate) was added, and then an organic binder and water were added thereto, followed by drying and granulating, so as to provide nitride mixed powder.

The nitride mixed powder was charged in a mold and press-molded at a pressure of 5 MPa to provide a molded article. The molded article was then compressed by applying a pressure of 20 to 100 MPa with a cold isotactic press (CIP) equipment (ADW800, trade name, available from Kobe Steel, Ltd.). The compressed molded article was sintered by holding at 2,000° C. for 10 hours with a batch type high frequency furnace (FTH-300-1H, trade name, available from Fujidempa Kogyo Co., Ltd.), so as to produce a boron nitride porous material. The baking was performed while regulating the interior of the furnace to a nitrogen atmosphere by allowing nitrogen to flow inside the furnace at a flow rate of 10 L/min under the normal condition. The resulting boron nitride porous material had an average pore diameter of the fine pores of 3.6 μm. The resulting boron nitride porous material had a porosity of 44% by volume.
(Production of Thermosetting Composition)

The following materials were used for producing the thermosetting composition.

Epoxy compound: "HP-4032D", trade name, available from DIC Corporation

Cyanate compound: "TA-CN", trade name, available from Mitsubishi Gas Chemical Co., Inc.

Benzoxazine compound: "F-a type Benzoxazine", trade name, available from Shikoku Chemicals Corporation Metal-based curing accelerator: bis(2,4-pentanedionato) zinc(II), available from Tokyo Kasei Kogyo Co., Ltd.

66 parts by mass of the epoxy compound, 23 parts by mass of the cyanate compound, and 11 parts by mass of the benzoxazine compound or the ester compound were placed in a vessel. 0.01 part by mass of the metal-based curing accelerator per 100 parts by mass in total of the epoxy compound, the cyanate compound, and the benzoxazine compound or the ester compound was placed in the vessel. The materials placed in the vessel were mixed under heating to approximately 80° C., so as to produce the thermosetting composition.
(Impregnation of Voids of Porous Material with Thermosetting Composition)

The boron nitride porous material was impregnated with the thermosetting composition in the following manner. The boron nitride porous material and the thermosetting composition placed in a vessel were placed in a vacuum heating impregnating equipment ("G-555AT-R", trade name, available from Kyoshin Engineering Corporation). The interior of the equipment was then deaerated for 10 minutes under a deaeration temperature of 100° C. and a deaeration pressure of 15 Pa. After the deaeration, the boron nitride porous material was immersed in the thermosetting composition for 40 minutes while retaining the condition, so as to impregnate the boron nitride porous material with the thermosetting composition.

Thereafter, the vessel having the boron nitride porous material and the thermosetting composition placed therein was taken out, placed in a pressure heating impregnating equipment ("HP-4030AA-H45", trade name, available from Kyoshin Engineering Corporation), and retained under condition of an impregnation temperature of 130° C. and an impregnation pressure of 3.5 MPa for 120 minutes, so as to impregnate the boron nitride porous material further with the thermosetting composition. Thereafter, the boron nitride porous material impregnated with the thermosetting composition was taken out from the equipment, and the boron nitride porous material impregnated with the thermosetting composition was heated under condition of a heating temperature of 120° C. and the atmospheric pressure for a prescribed period of time. Consequently, the thermosetting composition was semi-cured, and the boron nitride porous material having voids filled with a semi-cured material of the thermosetting composition was thus produced.

The resulting boron nitride porous material was sliced with a wire saw to produce a porous boron nitride sheet having voids filled with a semi-cured material of the thermosetting composition of 50 mm×50 mm×0.4 mm.

[Production of Circuit Board 1]

The following materials were prepared in addition to the porous boron nitride sheet.

Copper foil 1: electrolytic copper foil (available from Hitachi Metals Neomaterial, Ltd., size: 50 mm×50 mm×0.035 mm, ten-point average roughness (Rz) of M-surface: 10.3 μm)

Copper foil 2: rolled copper foil of oxygen free copper having one roughened surface (available from Hitachi Metals Neomaterial, Ltd., size: 50 mm×50 mm×0.3 mm, ten-point average roughness (Rz) of roughened surface: 15.4 μm)

Cushioning material: single cushioning material ("YOM" (registered trade name) fluorine rubber grade, available from Yamauchi Co., Ltd., size: 50 mm×50 mm)

Release sheet: Teflon (registered trade name) sheet ("Nitoflon", trade name, available from Nitto Denko Corporation, size: 50 mm×50 mm×0.05 mm)

A manual hydraulic vacuum heat pressing equipment (Model "IMC-1674", available from Imoto Machinery Co., Ltd.) was preheated at a set temperature of 200° C. After confirming that the heat plate temperature of the manual hydraulic vacuum heat pressing equipment was 200° C. with a contact thermometer, a laminate 1 including cushioning material/release sheet/copper foil 1/porous boron nitride sheet/copper foil 2/release sheet/cushioning material laminated in this order was set at the center position of the heat plate of the manual hydraulic vacuum heat pressing equipment preheated. After closing the front door of the manual hydraulic vacuum heat pressing equipment, the heat plate was manually elevated to pressurize the laminate 1 until a pressure of 15 MPa. After the pressure reached 15 MPa, the vacuum pump of the manual hydraulic vacuum heat pressing equipment was driven, and the valve was operated, so as to make the interior of the manual hydraulic vacuum heat pressing equipment to a vacuum state (pressure of interior of manual hydraulic vacuum heat pressing equipment: 2.6 kPa). The laminate 1 was pressurized in this state for 30 minutes while retaining a pressure of 15 MPa. After 30 minutes from the start of the pressurization, the heat plate was descended, the leak valve was opened, and then the pressurized laminate 1 was taken out from the manual hydraulic vacuum heat pressing equipment. The cushioning materials and the release sheets were removed from the laminate 1 to provide a laminate 2 including copper foil 1/porous boron nitride sheet/copper foil 2 laminated in this order.

Figure 7:
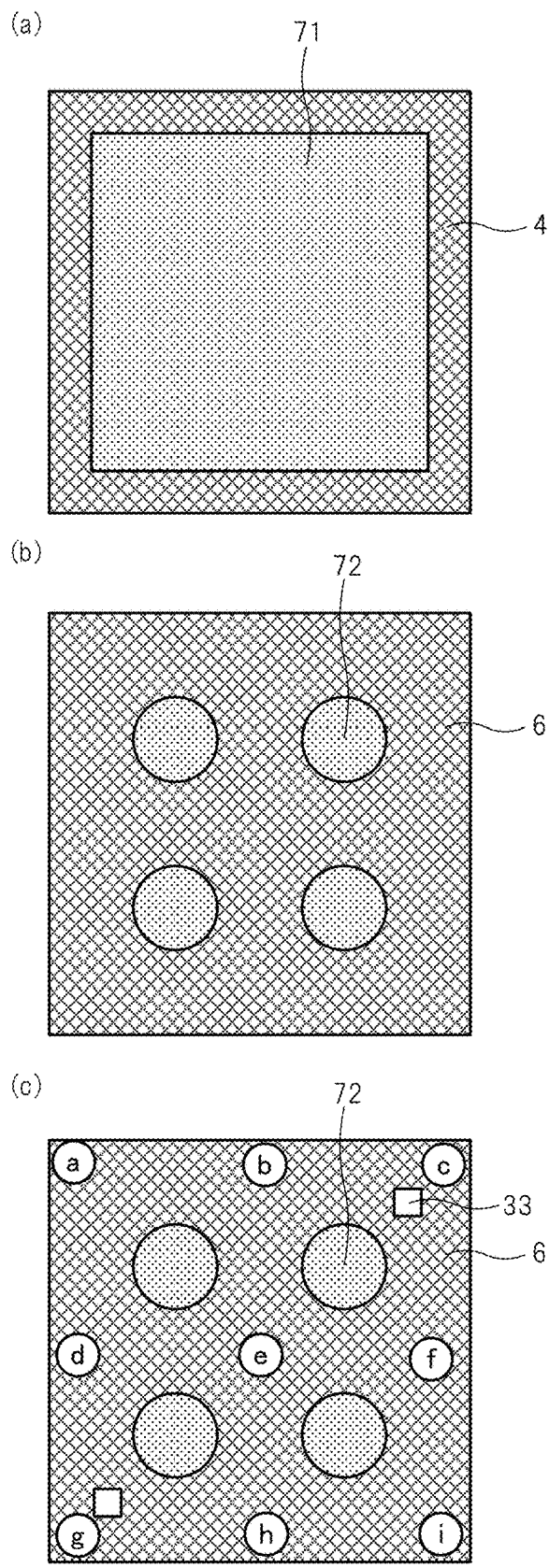
FIGS. 7(a) and 7(b) are schematic illustrations for describing the disposition of the photoresist in the method of producing a circuit board in the examples.
FIG. 7(c) is a schematic illustration for describing the disposition of the opening.

As shown in FIG. 7(a), a dry film resist (corresponding to symbol 71) having a size of 40 mm×40 mm was laminated at the center position of the copper foil 1 (corresponding to symbol 4) of the laminate 2, and then irradiated with UV light to cure the dry film resist. The part of the copper foil 1 having no dry film resist laminated thereon was removed with a sulfuric acid-hydrogen peroxide etching solution, and then the dry film resist was removed to make the size of the copper foil 1 of the laminate 2 to 40 mm×40 mm. According to the procedure, the range within 5 mm from the outer edges of the laminate 2 became a zone having no copper foil 1 existing thereon. Subsequently, the surface of the copper foil 1 was subjected to intergranular etching through an NBD treatment, and thereby the surface of the copper foil 1 was roughened. The ten-point average roughness (Rz) of the surface of the copper foil 1 after roughening was 3.2 μm.

The manual hydraulic vacuum heat pressing equipment was preheated at a set temperature of 125° C. After confirming that the heat plate temperature of the manual hydraulic vacuum heat pressing equipment was 125° C. with a contact thermometer, a laminate 3 including cushioning material/copper foil 1/porous boron nitride sheet/laminate 2 (copper foil 1/porous boron nitride sheet/copper foil 2)/cushioning material laminated in this order was set at the center position of the heat plate. After closing the front door of the manual hydraulic vacuum heat pressing equipment, the heat plate was manually elevated to pressurize the laminate 3 until a pressure of 10 MPa. After the pressure reached 10 MPa, the vacuum pump of the manual hydraulic vacuum heat pressing equipment was driven, and the valve was operated, so as to make the interior of the manual hydraulic vacuum heat pressing equipment to a vacuum state (pressure of interior of manual hydraulic vacuum heat pressing equipment: 2.6 kPa). The laminate 3 was pressurized in this state for 30 minutes while retaining a pressure of 10 MPa. After 30 minutes from the start of the pressurization, the set temperature of the manual hydraulic vacuum heat pressing equipment was changed to 200° C. The laminate was further pressurized at a heating temperature of 200° C. for 30 minutes. After 30 minutes from the start of the pressurization at a heating temperature of 200° C., the heat plate was descended, the leak valve was opened, and then the pressurized laminate 3 was taken out from the manual hydraulic vacuum heat pressing equipment. The cushioning materials were removed from the laminate 3 to provide a laminate 4 including copper foil 1/porous boron nitride sheet/laminate 2 (copper foil 1/porous boron nitride sheet/copper foil 2) laminated in this order.

As shown in FIG. 7(b), four plies circular dry film resists (diameter: 1.0 cm) (corresponding to symbol 72) were laminated on the copper foil 1 (corresponding to symbol 6) of the laminate 4, and then irradiated with UV light to cure the dry film resist. The part of the copper foil 1 having no dry film resist laminated thereon was removed with a sulfuric acid-hydrogen peroxide etching solution, and then the dry film resist was removed to produce the laminate 4 having four circular copper foil layers having a diameter of 1.0 cm on the surface thereof.

As shown in FIG. 7(c), two openings (corresponding to symbol 33) having a square shape in the plane view (length of one edge: 3 mm) reaching the copper foil 1 existing inside the laminate 4 were formed with a carbon dioxide gas laser working machine, so as to produce a circuit board 1. The circuit board 1 had a layer structure including copper foil 1/porous boron nitride sheet/copper foil 1/porous boron nitride sheet/copper foil 2, which corresponded to the structure of the circuit board 1 according to one embodiment of the present invention including third metal layer 6/second ceramic layer 3/first metal layer 4/first ceramic layer 2/second metal layer 5. In the following description, the copper foil 1 as the first layer of the circuit board 1 may be referred to as the third metal layer, the porous boron nitride sheet as the second layer thereof may be referred to as the second ceramic layer, the copper foil 1 as the third layer thereof may be referred to as the first metal layer, the porous boron nitride sheet as the fourth layer thereof may be referred to as the first ceramic layer, and the copper foil 2 as the fifth layer thereof may be referred to as the second metal layer, in some cases.

[Production of Circuit Board 2]

The laminate 3 was pressurized at a heating temperature of 150° C. instead of pressurizing the laminate 3 at a heating temperature of 125° C. Other than that procedure, a circuit board 2 was produced in the same manner as in the circuit board 1.

[Production of Circuit Board 3]

The laminate 3 was pressurized at a heating temperature of 175° C. instead of pressurizing the laminate 3 at a heating temperature of 125° C. Other than that procedure, a circuit board 2 was produced in the same manner as in the circuit board 1.

[Production of Circuit Board 4]

In the production of the circuit board 1, the laminate 3 was pressurized at a heating temperature of 125° C. for 30 minutes, and then pressurized at a heating temperature of 200° C. for 30 minutes. In the production of a circuit board 4, however, the laminate 3 was not pressurized at a heating temperature of 125° C., but was pressurized at a heating temperature of 200° C. for 30 minutes. Other than that procedure, a circuit board 4 was produced in the same manner as in the circuit board 1.

[Production of Circuit Board 5]

The structure of the laminate 3 was changed from the structure including cushioning material/copper foil 1/porous boron nitride sheet/laminate 2/cushioning material to a structure including cushioning material/copper foil 2/porous boron nitride sheet/laminate 2/cushioning material. Other than that procedure, a circuit board 5 was produced in the same manner as in the circuit board 4.

[Production of Circuit Board 6]

The structure of the laminate 2 was changed from the structure including copper foil 1/porous boron nitride sheet/copper foil 2 to a structure including porous boron nitride sheet/copper foil 2. Other than that procedure, a circuit board 6 was produced in the same manner as in the circuit board 4. The circuit board 6 had no first metal layer.

[Production of Circuit Board 7]

The pressure in pressurizing the laminate 3 was changed from 10 MPa to 0.1 MPa. Other than that procedure, a circuit board 7 was produced in the same manner as in the circuit board 4.

The circuit boards 1 to 7 produced were evaluated as follows.

[Measurement of Thickness of Ceramic Layer]

The thicknesses of the first ceramic layer at the positions of symbols a to d and f to i in FIG. 7(c), the thicknesses of the second ceramic layer at the positions of symbols b, d to f, and h in FIG. 7(c), and the total thicknesses of the thickness of the first ceramic layer and the thickness of the second ceramic layer at the positions of symbols a to d and f to i in FIG. 7(c) were measured with an eddy current film thickness meter ("ISOSCOPE EMP10", trade name, available from Fischer Instruments K.K.). The average values of the measured thicknesses were designated as the thickness of the first ceramic layer, the thickness of the second ceramic layer, and the total thickness of the thickness of the first ceramic layer and the thickness of the second ceramic layer in the circuit board.

[Confirmation of Conduction to First Metal Layer in Opening]

Whether or not the first metal layer was conducted in the opening was confirmed with a circuit tester ("Card High Tester", trade name, available from Hioki E.E. Corporation) In the case where the resin of the second ceramic layer remains in the opening, the first metal layer cannot be conducted.

[Insulation Durability]

The voltage resistances of the first ceramic layer and the second ceramic layer were measured according to JIS C2110 with a voltage resistance tester ("TOS 5101", trade name, available from Kikusui Electronics Corporation). For the measurement of the voltage resistance of the first ceramic layer, the first metal layer and the second metal layer were used. For the measurement of the voltage resistance of the second ceramic layer, the first metal layer and the third metal layer were used.

The measurement condition was as follows.

Stepwise voltage rising condition: 0.2 kV/20 sec in range of 2.0 to 5.0 kV AC, 0.5 kV/30 sec in range of 5.0 to 10.0 kV AC Cutoff current value: 100 mA

[Confirmation of Defects in Insulating Layer]

The circuit board was cut out in the thickness direction to produce a specimen enabling the observation of the cross section of the circuit board. The cut out specimen was embedded in a resin, and then the part corresponding to the cross section of the circuit board as the specimen was wet polished with an automatic polisher. After drying the polished specimen, the polished surface was coated with osmium. The interface between the first ceramic layer and the second ceramic layer in the metal layer non-existing zone, and the vicinity of the side surface of the first metal layer were observed with a scanning electron microscope (SEM) ("JMC-6000Plus", trade name, available from JEOL, Ltd.) at a magnification of 100. The presence of the joint between the first ceramic layer and the second ceramic layer, the presence of gaps between the side surface of the first metal layer and the second ceramic layer, and the presence of cracks in the vicinity of the side surface of the first metal layer were confirmed.

[Operation Stability of Electronic Device]

A module having three electronic devices (p-mos-FET (insulated gate field effect transistor), "2SK2174S", trade name, available from Hitachi, Ltd.) implemented on a circuit conductor or a conductor circuit at an interval of 2 mm was produced, and the presence of a false operation was evaluated by continuously operating for 96 hours in a 100° C. environment while regulating the consumed electric power to 10 W per one device. In the case where no false operation occurred, the evaluation was again performed by adding 10 W to the consumed electric power. By increasing the consumed electric power in the same manner, the operation stability of the power electronic device was evaluated by the consumed electric power at which a false operation occurred.

The evaluation results of the evaluations are shown in Table 1. As one example, the SEM image of the vicinity of the side surface of the first metal layer on the cross section of the circuit board 5 is shown in FIG. 8.

106: Third metal foil
111, 111A, 112, 112A: Laminate

TABLE 1

|  |  |  | Circuit board 1 Example | Circuit board 2 Example | Circuit board 3 Example | Circuit board 4 Example | Circuit board 5 Example | Circuit board 6 Comparative Example | Circuit board 7 Comparative Example |
|---|---|---|---|---|---|---|---|---|---|
| Third metal layer | Thickness | μm | 35 | 35 | 35 | 35 | 300 | 35 | 35 |
| Second ceramic layer | Thickness | μm | 331.2 | 319.2 | 309.6 | 306.8 | 313.2 | 302.5 | 400 |
|  | Voltage resistance | kV | >10 | >10 | >10 | >10 | >10 | — | 4.2 |
| First metal layer | Thickness | μm | 35 | 35 | 35 | 35 | 35 | — | 35 |
| First ceramic layer | Thickness | μm | 324.2 | 320.3 | 325.2 | 318.9 | 320.2 | 323.8 | 323.8 |
|  | Voltage resistance | kV | >10 | >10 | >10 | >10 | >10 | >10 | >10 |
| Second metal layer | Thickness | μm | 300 | 300 | 300 | 300 | 300 | 300 | 300 |
| Total thickness of first and second ceramic layers |  | μm | 686.0 | 675.8 | 684.0 | 663.5 | 679.5 | 626.3 | unmeasurable |
| Presence of joint between first ceramic layer and second ceramic layer in metal layer non-existing zone |  |  | yes | yes | yes | yes | yes | yes | no |
| Presence of defects in vicinity of side surface of first metal layer |  |  | no | no | no | no | no | no | yes |
| Presence of conductivity in opening |  |  | yes | yes | yes | yes | yes | yes | yes |
| Operation stability of electronic device |  |  | >50 | >50 | >50 | >50 | >50 | 30 | >50 |

It is understood from the examples that a circuit board that has a high thermal conductivity, is excellent in voltage resistance, and has an electrode thereinside can be produced by using a porous boron nitride sheet, which is a porous material of hard ceramics. As the boron nitride porous material having voids filled with the cured material of the thermosetting composition obviously has a high thermal conductivity, from which it is understood that the circuit boards of the examples also have a high thermal conductivity. Even by using a porous boron nitride sheet, which is a porous material of hard ceramics, the first ceramic layer and the second ceramic layer can be joined without occurrence of gaps between the first ceramic layer and the second ceramic layer even though an electrode is provided therein, by controlling the pressurizing condition in laminating the porous boron nitride sheet.

It is understood from the evaluation result of the circuit board 6 as a comparative example that the absence of the first metal layer in the circuit board deteriorates the operation stability of the electronic device mounted on the circuit board. It is understood therefrom that the first metal layer of the circuit board functions as a noise shield for suppressing the influence of noise on the electronic device. It is understood from the evaluation result of the circuit board 7 as a comparative example that the first ceramic layer and the second ceramic layer are not joined to each other, and the voltage resistance of the circuit board is deteriorated.

REFERENCE SIGN LIS

1, 1A: Circuit board
2: First ceramic layer
3: Second ceramic layer
4: First metal layer
5: second metal layer
6: third metal layer
11: Metal layer existing zone
12: Metal layer non-existing zone
71, 72: Photoresist
102: First ceramic sheet
103: Second ceramic sheet
104: First metal foil
105: Second metal foil

The invention claimed is:

1. A circuit board comprising
a first ceramic layer,
a second ceramic layer laminated on the first ceramic layer, and
a first metal layer disposed between the first ceramic layer and the second ceramic layer,
having a metal layer existing zone having the first metal layer existing between the first ceramic layer and the second ceramic layer, and a metal layer non-existing zone having no first metal layer existing between the first ceramic layer and the second ceramic layer,
the first ceramic layer and the second ceramic layer being joined to each other in the metal layer non-existing zone,
the second ceramic layer being a porous boron nitride layer having voids filled with a cured material of a thermosetting composition, wherein
a metal used in the first metal layer is at least one metal selected from the group consisting of copper, aluminum, nickel, iron, tin, gold, silver, titanium, and stainless steel,
the circuit board further comprises a second metal layer that is joined to a surface of the first ceramic layer opposite to a surface thereof on the side of the second ceramic layer, and
the second metal layer has a thickness of 0.2 to 5.0 mm.

2. The circuit board according to claim 1, wherein the first ceramic layer is a porous boron nitride layer having voids filled with a cured material of a thermosetting composition.

3. The circuit board according to claim 1, wherein the first metal layer has a thickness that is ¼ or less of a thickness of the second ceramic layer.

4. The circuit board according to claim 1, wherein the first metal layer has a side surface that is covered with the second ceramic layer.

5. The circuit board according to claim 1, wherein the circuit board further comprises a third metal layer that is formed on a surface of the second ceramic layer opposite to a surface thereof on the side of the first ceramic layer.

6. The circuit board according to claim 1, wherein the second ceramic layer has an opening, and the first metal layer is exposed in the opening.

7. A method of producing a circuit board, comprising
a step of producing a first laminate comprising disposing a first metal layer on a first ceramic layer, and disposing a second metal layer on the first ceramic layer to a surface of the first ceramic layer opposite to a surface thereof on the side of the first metal layer, and pressurizing under heating, so as to produce the first laminate,
a step of producing a second laminate comprising disposing a second ceramic layer on the first metal layer of the first, and pressurizing at a pressure of 1 to 20 MPa for a pressurizing time of 10 minutes to 30 hours under heating to a heating temperature of 150 to 260° C., so as to produce the second laminate in which the first metal layer is disposed between the first ceramic layer and the second ceramic layer, wherein a metal used in the first metal layer is at least one metal selected from the group consisting of copper, aluminum, nickel, iron, tin, gold, silver, titanium, and stainless steel, and wherein the second metal layer has a thickness of 0.2 to 5.0 mm,
the second ceramic layer being a porous boron nitride layer having voids filled with a semi-cured material of a thermosetting composition.

8. The method of producing a circuit board according to claim 7, wherein the step of producing the second laminate includes pressurizing under heating in vacuum.

9. The method of producing a circuit board according to claim 7, wherein the method further comprises a step of roughening a surface of the first metal layer of the first laminate.

10. The method of producing a circuit board according to claim 7, wherein the pressurizing in the step of producing the first laminate is at a pressure of 1 to 20 MPa for a pressurizing time of 10 minutes to 30 hours under heating to a heating temperature of 150 to 260° C., and
the first ceramic layer is a porous boron nitride layer having voids filled with a semi-cured material of a thermosetting composition.

11. The method of producing a circuit board according to claim 10, wherein pressurizing in the step of producing the first laminate is under heating in vacuum.

12. The method of producing a circuit board according to claim 7, wherein the step of producing the second laminate further includes disposing a third metal layer on the second ceramic layer, and pressurizing under heating, so as to produce the second laminate further including a third metal layer laminated on the second ceramic layer.

13. The method of producing a circuit board according to claim 7, wherein the method further comprises a step of forming an opening in the second ceramic layer of the second laminate, so as to expose the first metal layer.

* * * * *